US012591014B2

(12) United States Patent
Kitagawa et al.

(10) Patent No.: US 12,591,014 B2
(45) Date of Patent: Mar. 31, 2026

(54) BATTERY MEASUREMENT METHOD AND APPARATUS FOR COMPLEX IMPEDANCE MEASUREMENT

(71) Applicant: DENSO CORPORATION, Kariya-city (JP)

(72) Inventors: Masaaki Kitagawa, Kariya-city (JP); Shun Miyauchi, Kariya-city (JP); Isao Ishibe, Kariya-city (JP)

(73) Assignee: DENSO CORPORATION, Kariya (JP)

( * ) Notice: Subject to any disclaimer, the term of this patent is extended or adjusted under 35 U.S.C. 154(b) by 164 days.

(21) Appl. No.: 18/399,074

(22) Filed: Dec. 28, 2023

(65) Prior Publication Data

US 2024/0133960 A1    Apr. 25, 2024
US 2024/0230770 A9    Jul. 11, 2024

Related U.S. Application Data

(63) Continuation of application No. PCT/JP2022/022532, filed on Jun. 2, 2022.

(30) Foreign Application Priority Data

Jun. 30, 2021    (JP) ................................. 2021-109557

(51) Int. Cl.
   *G01R 31/3835*      (2019.01)
   *H01M 10/42*       (2006.01)
   *H02J 7/00*        (2006.01)

(52) U.S. Cl.
   CPC .... *G01R 31/3835* (2019.01); *H01M 10/4285* (2013.01); *H02J 7/0047* (2013.01)

(58) Field of Classification Search
   CPC .... G01R 27/02; G01R 31/36; G01R 31/3648; G01R 31/3835; G01R 31/389;
                    (Continued)

(56) References Cited

U.S. PATENT DOCUMENTS 5,047,722 A * 9/1991 Wurst ................... G01R 31/389
                                       324/436
6,002,238 A * 12/1999 Champlin ............ G01R 31/389
                                 320/DIG. 12

(Continued)

FOREIGN PATENT DOCUMENTS

JP       2003-090869 A     3/2003
JP       2018-190502 A    11/2018
KR      10-1567248 B2    11/2015

*Primary Examiner* — Vinh P Nguyen
(74) *Attorney, Agent, or Firm* — Oliff PLC

(57) ABSTRACT

In a battery measurement apparatus, a current controller sets a predetermined wavenumber of each of first and second alternating signals, and determines whether an input or an output of the predetermined wavenumber of one of the first and second alternating signals to or from a rechargeable battery has completed. The current controller switches, in response to determination that the input or output of the predetermined wavenumber of one of the first and second alternating signals to or from the rechargeable battery has completed, the completed one of the first and second alternating signals to a new alternating signal having another frequency while continuing the input or output of the other of the first and second alternating signals to or from the rechargeable battery.

11 Claims, 9 Drawing Sheets

(58) Field of Classification Search
CPC ........................ G01R 31/392; H01M 10/4285;
H01M 10/48; H02J 7/00; H02J 7/0047;
Y02E 60/10
See application file for complete search history.

(56) References Cited

U.S. PATENT DOCUMENTS

| | | | | |
|---|---|---|---|---|
| 9,035,623 | B1 * | 5/2015 | Berkowitz .......... | H02J 7/00712 |
| | | | | 320/112 |
| 9,461,321 | B2 * | 10/2016 | Park .................. | H01M 8/04649 |
| 9,660,299 | B2 * | 5/2017 | Xu ........................ | H01M 10/42 |
| 11,237,216 | B1 * | 2/2022 | Chang ................. | H01M 10/052 |
| 11,709,219 | B2 * | 7/2023 | Morrison ............. | G01R 35/005 |
| | | | | 702/104 |
| 11,728,525 | B2 * | 8/2023 | Ghantous .............. | H02J 7/0047 |
| | | | | 702/63 |
| 11,835,588 | B2 * | 12/2023 | Kitagawa ............. | G01R 31/389 |
| 2021/0018570 | A1 | 1/2021 | Kitagawa | |

* cited by examiner

BATTERY MEASUREMENT METHOD AND APPARATUS FOR COMPLEX IMPEDANCE MEASUREMENT

REFERENCE TO RELATED APPLICATIONS

The present application is a bypass continuation application of a currently pending international application No. PCT/JP2022/022532 designating the United States of America, the entire disclosure of which is incorporated herein by reference, the international application being based on and claiming the benefit of priority of Japanese Patent Application No. 2021-109557 filed on Jun. 30, 2021. The disclosure of each of the international application and the Japanese Patent Application No. 2021-109557 is incorporated in its entirety herein by reference.

TECHNICAL FIELD

The present disclosure relates to battery measurement apparatuses and battery measurement methods.

BACKGROUND

Users of a rechargeable battery have performed measurement of, for example, an internal impedance of the rechargeable battery in order to recognize the performance of the rechargeable battery. Japanese Patent Application Publication No. 2003-90869 discloses an impedance measurement procedure that causes a rechargeable battery to output a plurality of alternating currents that respectively have predetermined frequencies, and analyzes, for each of the frequencies of the alternating currents, how a voltage across the rechargeable battery varies to accordingly measure an internal impedance of the rechargeable battery in a relatively short time.

SUMMARY

Ensuring a sufficient level of impedance-measurement accuracy requires averaging of measured voltage variations to accordingly reduce errors included in the measured voltage variations. This requirement therefore needs output of the alternating currents, each of which has a certain wavenumber, from the rechargeable battery. In other words, this requirement needs a certain number of measured voltage variations. The wavenumber of any alternating current per unit time, which has a given frequency, is different from that of another alternating current per unit time, which has another frequency. That is, in order to ensure a certain number of measured voltage variations, a longer output of a low-frequency alternating current is required as compared with a high-frequency alternating current.

The impedance measurement procedure disclosed in the patent publication, which causes a rechargeable battery to output a plurality of different-frequency alternating currents, needs to determine an output period of each alternating current; the determined output period of the lowest-frequency alternating current enables the lowest-frequency alternating current to have a required wavenumber. In other words, the output period of each of the different-frequency alternating currents is determined with reference to the output period of the lowest-frequency alternating current. This may result in higher-frequency alternating currents than the lowest-frequency alternating current being each outputted for an unnecessary long time. That is, the impedance measurement procedure disclosed in the patent publication may have a room for improvement.

In view of such an issue, the present disclosure seeks to provide battery measurement apparatuses and battery measurement methods, each of which is capable of measuring an impedance of a rechargeable battery with higher efficiency.

In order to solve such an issue, the present disclosure provides a battery measurement apparatus for measuring a state of a rechargeable battery. The battery measurement apparatus includes a current controller configured to perform one of (i) a first task of causing the rechargeable battery to output a composite wave signal that is combination of at least first and second alternating signals, the first and second alternating signals respectively having first and second frequencies different from one another, and (ii) a second task of causing the first and second alternating signals to be inputted to the rechargeable battery as the composite wave signal. The battery measurement apparatus includes a voltage measurement unit configured to measure a voltage variation across the rechargeable battery in response to the composite wave signal. The battery measurement apparatus includes a calculator configured to analyze, for each of the first and second frequencies, the voltage variation in accordance with the first and second alternating signals and the voltage variation to accordingly calculate information on a complex impedance of the rechargeable battery. The current controller is configured to set a predetermined wavenumber of each of the first and second alternating signals, and determine whether an input or an output of the predetermined wavenumber of one of the first and second alternating signals to or from the rechargeable battery has completed. The current controller is configured to switch, in response to determination that the input or output of the predetermined wavenumber of one of the first and second alternating signals to or from the rechargeable battery has completed, the completed one of the first and second alternating signals to a new alternating signal having another frequency while continuing the input or output of the other of the first and second alternating signals to or from the rechargeable battery.

Additionally, in order to solve such an issue, the present disclosure provides a battery measurement method to be carried out by a battery measurement apparatus for measuring a state of a rechargeable battery. The battery measurement method includes a performing step of performing one of (i) a first task of causing the rechargeable battery to output a composite wave signal that is combination of at least first and second alternating signals, the first and second alternating signals respectively having first and second frequencies different from one another, and (ii) a second task of causing the first and second alternating signals to be inputted to the rechargeable battery as the composite wave signal. The battery measurement method includes a measuring step of measuring a voltage variation across the rechargeable battery in response to the composite wave signal. The battery measurement method includes a calculating step of analyzing, for each of the first and second frequencies, the voltage variation in accordance with the first and second alternating signals and the voltage variation to accordingly calculate information on a complex impedance of the rechargeable battery. The performing step further includes (I) Setting a predetermined wavenumber of each of the first and second alternating signals (II) Determining whether an input/output of the predetermined wavenumber of one of the first and second alternating signals to or from the rechargeable battery has completed (III) Switching, in response to determination that the input or output of the predetermined wavenumber of one of the first and second alternating signals to or from the rechargeable battery has completed, the completed one of the first and second alternating signals to a new alternating signal having another frequency while continuing the input or output of the other of the first and second alternating signals to or from the rechargeable battery.

Each of the above battery measurement apparatus and method makes it possible to, after the output period of the first alternating signal, output, as a new composite wave signal, combination of the new alternating signal having another frequency and the second alternating signal without waiting for termination of the output period of the second alternating signal as an alternating current.

This configuration therefore enables measurement of the complex impedance of the rechargeable battery with higher efficiency as compared with a comparative example where a new composite wave signal is outputted after termination of the output period of the second alternating signal.

Additionally, the above configuration of the battery measurement apparatus, which enables output of the first and second alternating signals respectively having (i) the predetermined wavenumbers and (ii) the different frequencies, makes it possible to maintain the calculation accuracy of the complex impedance of the rechargeable battery.

BRIEF DESCRIPTION OF THE DRAWINGS

The above object, other objects, characteristics, and advantageous benefits of the present disclosure will become apparent from the following description with reference to the accompanying drawings in which.

DETAILED DESCRIPTION

First Embodiment

The following describes a power supply system 10 of a vehicle, such as a hybrid vehicle or an electric vehicle, with reference to the accompanying drawings; a battery measurement apparatus according to the first embodiment has been applied.

Figure 1:
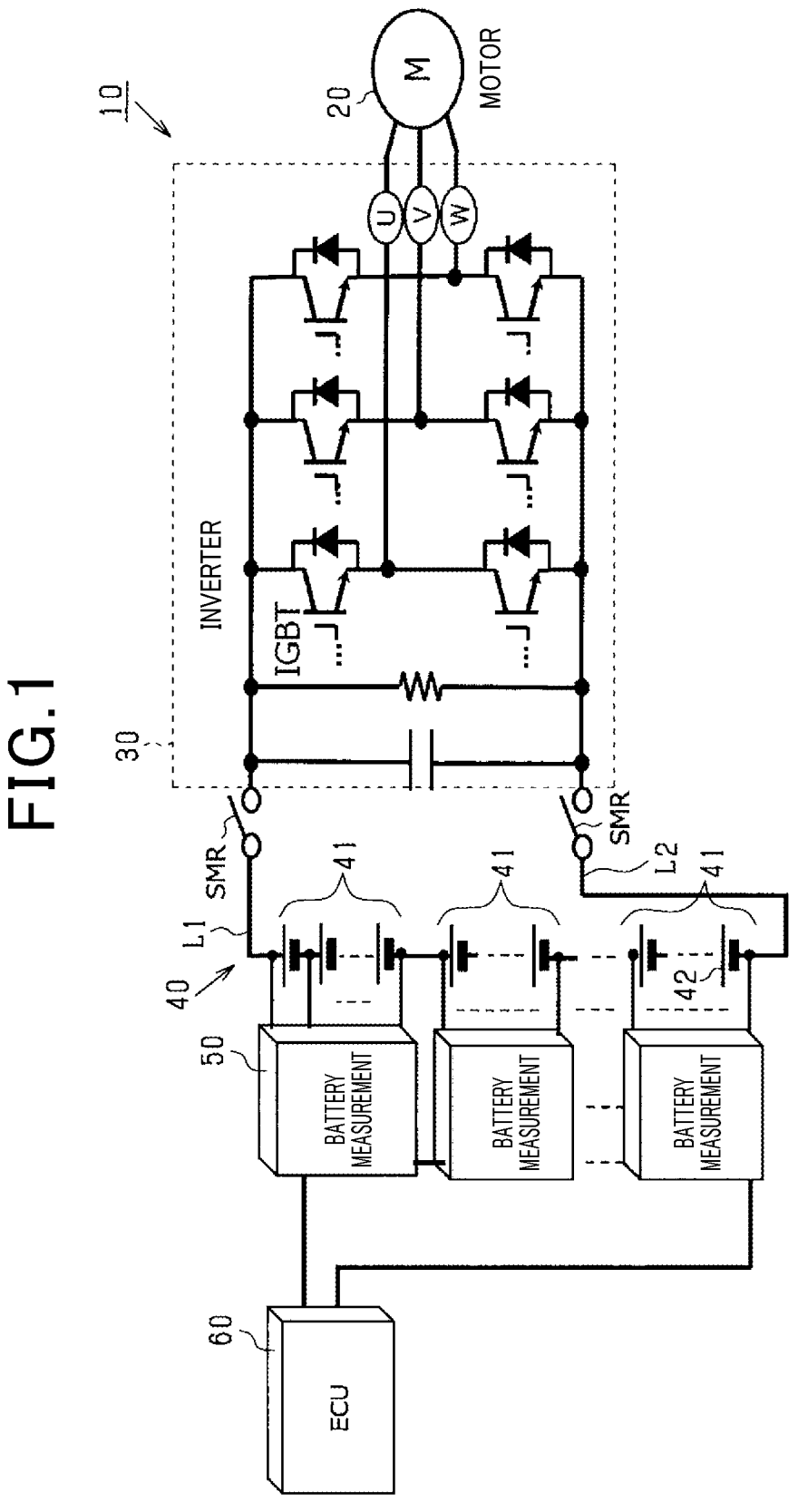
FIG. 1 is a circuit diagram illustrating a schematic configuration of a power supply system.

The power supply system 10 includes, as illustrated in FIG. 1, a motor 20, an inverter 30, a battery pack 40, a battery measurement apparatus 50, and an electronic control unit (ECU) 60. The motor 20 is used as an example of a rotary electric machine. The inverter 30 serves as a power converter for supplying three-phase currents to the motor 20. The battery pack 40 is configured to be rechargeable. The battery measurement apparatus 50 is capable of measuring various states of the battery pack 40. The ECU 60 is configured to control, for example, the motor 20.

The motor 20 serves as a main engine in the vehicle, and is configured to be capable of power transfer between the motor 20 and one or more driving wheels of the vehicle. The power supply system 10 of the first embodiment uses a three-phase permanent magnet synchronous motor as the motor 20.

The inverter 30 is configured as a full-bridge circuit comprised of plural sets of upper- and lower-arm switches; the number of sets of the upper- and lower-arm switches is the same as the number of phases of phase windings of the motor 20. On-off switching operations of the respective upper- and lower-arm switches, such as semiconductor switches, of each set enables adjustment of a current supplied to each phase winding of the motor 20.

The inverter 30 includes an unillustrated inverter controller. The inverter controller is configured to perform power-supply tasks of the on-off switching operations of the respective upper- and lower-arm switches of each set of the full-bridge circuit in accordance with (i) various measurement information items measured in the motor 20 and (ii) a power-running request or a power-generation request. That is, one of the power-supply tasks of the inverter controller supplies electrical power from the battery pack 40 to the motor 20 through the inverter 30 to accordingly cause the motor 20 to drive in a power-running mode. Additionally, another one of the power-supply tasks of the inverter controller causes the motor 20 to generate electrical power based on rotational power of the driving wheels, and supplies the generated electrical power to the battery pack 40, thus charging the battery pack 40.

The battery pack 40 is electrically connected to the motor 20 through the inverter 30.

The battery pack 40 is comprised of a plurality of battery modules 41 connected in series. The battery pack 40 has a predetermined terminal voltage of, for example, several hundred volts or more, thereacross. Each of the battery modules 41 is comprised of a plurality of battery cells 42 connected in series. A lithium-ion battery cell, a nickel-hydrogen battery cell, or a nickel-metal-hydride battery cell can be used as each batter cell 42. Each battery cell 42 is a rechargeable battery cell comprised of plural electrodes and electrolyte.

The battery pack 40 has a positive power terminal and a negative-side power terminal. As illustrated in FIG. 1, a positive power path L1 is connected to the positive power terminal of the battery pack 40, and a negative power path L2 is connected to the negative power terminal of the battery pack 40. Each of the inverter 30 and one or more unillustrated electrical loads has positive and negative terminals. The positive terminal of each of the inverter 30 and the one or more unillustrated electrical loads is connected to the positive power path L1. The negative terminal of each of the inverter 30 and the one or more unillustrated electrical loads is connected to the negative power path L2.

The power supply system 10 includes relay switches SMR, each of which serves as a system main switch, provided on the respective positive and negative power paths L1 and L2. The power supply system 10 is configured such that the relay switches SMR can switch between power transfer between the battery pack 40 and the inverter 30 and power shut-off therebetween.

The battery measurement apparatus 50 is configured to measure, for example, the state of charge (SOC) and the state of health (SOH) of each battery cell 42. The battery measurement apparatus 50, which is connected to the ECU 60, is configured to measure the various states of each battery cell 42, and output the measured states of each battery cell 42 to the ECU 60. An exemplary structure of the battery measurement apparatus 50 will be described later.

The ECU 60 is configured to selectively transmit, to the inverter controller, one of the power-running request and the power-generation request in accordance with various information items that include, for example, an information item on an operating state of an accelerator of the vehicle, an information item on an operating state of a brake of the vehicle, a speed of the vehicle, and the measured states of each battery cell 42 of the battery pack 40.

Next, the following describes, in detail, the battery measurement apparatus 50.

Figure 2:
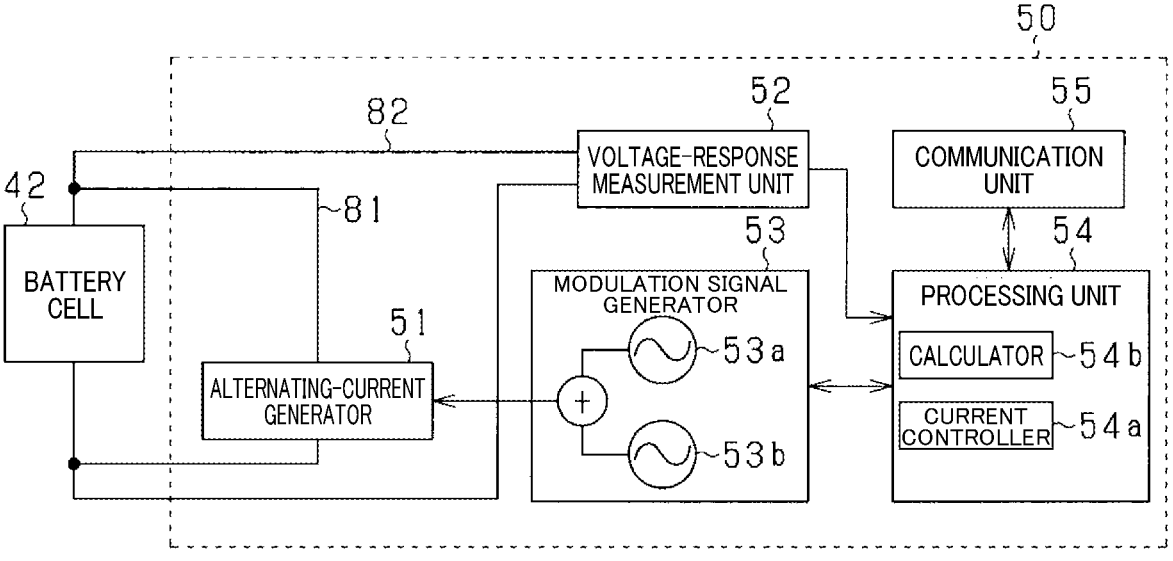
FIG. 2 is a block diagram illustrating a configuration of a battery measurement apparatus according to the first embodiment.

The battery measurement apparatus 50 is configured to, as illustrated in FIG. 2, measure the various states of each battery cell 42. Specifically, the battery measurement apparatus 50 includes an alternating-current generator 51, a voltage-response measurement unit 52, a modulation signal generator 53, a processing unit 54, a communication unit 55, first electrical paths 81, and second electrical paths 82.

The alternating-current generator 51 is connected to each battery cell 42 through a corresponding one of the first electrical paths 81. The voltage-response measurement unit 52 is connected to each battery cell 42 through a corresponding one of the second electrical paths 82. The modulation signal generator 53 is connected to the alternating-current generator 51. The processing unit 54 is connected to both the voltage-response measurement unit 52 and the modulation signal generator 53. The communication unit 55 is connected to the processing unit 54.

The alternating-current generator 51 is configured to cause a selected battery cell 42 as a measurement target to serves as a power source that outputs alternating currents. Specifically, the alternating-current generator 51 is configured to cause the selected battery cell 42 to output an alternating current based on an instruction signal inputted thereto from the modulation signal generator 53. The flow-out of the selected alternating current from the selected battery cell 42 results in a variation in the voltage across the selected battery cell 42. On this variation, which will be also referred to as a voltage variation, information on internal complex-impedance of the selected battery cell 42 is reflected. The voltage-response measurement unit 52 serves as a voltage measurement unit to measure the voltage variation, which will be also referred to as a response signal, of the selected battery cell 42 across the selected battery cell 42.

The modulation signal generator 53 includes a plurality of oscillators. For example, the modulation signal generator 53 according to the first embodiment includes a first oscillator 53a and a second oscillator 53b. The modulation signal generator 53 is configured to cause, in response to an instruction sent from the processing unit 54, the first and second oscillators 53a and 53b to output respective alternating signals. Then, the modulation signal generator 53 is configured to combine the alternating signals with one another, i.e., superimpose the first and second alternating signals on one another, to accordingly generate a composite wave signal. The alternating signal generated by the first oscillator 53a will also be referred to as a first alternating signal, and the alternating signal generated by the second oscillator 53b will also be referred to as a second alternating signal.

The first embodiment uses, as the alternating signals, sinusoidal-wave signals, but can use any alternating signals, such as rectangular-wave signals or triangular-wave signals. Each of the composite wave signal and the alternating signals has a direct-current (DC) bias, and the DC bias of each of the composite wave signal and the alternating signals prevents any alternating current flowing out from the selected battery cell 42 from becoming negative current, i.e., reverse current for the selected battery cell 42.

The modulation signal generator 53 is additionally configured to convert the composite wave signal into a digital composite-wave signal as the instruction signal, and output, to the alternating-current generator 51 to the instruction signal to accordingly instruct the alternating-current generator 51 to output an alternating current based on the instruction signal, i.e., the digital composite-wave signal. The modulation signal generator 53 does not need to always output the digital composite-wave signal as the instruction signal, and can be configured to output, as the instruction signal, a digital signal based on the first alternating-current signal or the second alternating-current signal.

The processing unit 54 is comprised of a microcomputer that includes a processor, such as a CPU, and a storage, such as various memories. The processor executes program instructions stored in the storage to accordingly implement various control functions. Each control function can be implemented by one or more hardware electronic circuits or by one or more hardware-software hybrid circuits.

For example, the processing unit 54 has a function of calculating the complex impedance of the selected battery cell 42.

The following schematically describes how the processing unit 54 calculates the complex impedance of the selected battery cell 42.

The processing unit 54 performs a first operation of instructing the modulation signal generator 53 to generate the instruction signal having a selected at least one of predetermined plural measurement frequencies for the complex impedance. The modulation signal generator 53 causes the alternating-current generator 51 to generate an alternating current having the selected at least one of the measurement frequencies from the selected battery cell 42. The voltage-response measurement unit 52 measures the voltage across the selected battery cell 42 to accordingly measure a variation in the voltage across the selected battery cell 42 as the response signal. Then, the voltage-response measurement unit 52 outputs the measured response signal to the processing unit 54.

The processing unit 54 performs a second operation of calculating, based on the response signal, an information item related to the complex impedance of the selected battery cell 42 for the selected at least one of the predetermined measurement frequencies.

Specifically, the processing unit 54 is configured to iterate the series of the first and second operations until the information items of values of the complex impedance of the selected battery cell 42 for all the predetermined measurement frequencies are calculated.

The processing unit 54 is configured to output, to the ECU 60, the measured values of the complex impedance of the selected battery cell 42 as measurement results for the selected battery cell 42.

The ECU 60 is configured to create a plot, i.e., a Cole-Cole plot, of the calculated values of the complex impedance of the selected battery cell 42 on the complex-impedance plane, and analyze the Cole-Cole plot of the calculated values of the complex impedance of the selected battery cell 42 on the complex-impedance plane to accordingly ascertain the characteristics of, for example, the positive and negative electrodes and the electrolyte, of the selected battery cell 42, and ascertain the state of charge (SOC) and the state of health (SOH) of the selected battery cell 42.

The ECU 60 may not necessarily create the Cole-Cole plot of all the values of the complex impedance of the selected battery cell 42 for all the predetermined measurement frequencies. For example, the battery measurement apparatus 50 can be configured to measure, at regular time intervals, a value of the complex impedance of a selected battery cell 42 for at least one specific measurement frequency selected from the predetermined measurement frequency while the vehicle is traveling, and the ECU 60 can be configured to ascertain the SOC, SOH, and/or temperature of the selected battery cell 42 in accordance with how the measured values of the complex impedance of the selected battery cell 42 for the at least one specific measurement frequency are changed over time. As another example, the battery measurement apparatus 50 can be configured to measure, every predetermined time, such as every day, every week, or every year, a value of the complex impedance of a selected battery cell 42 for at least one specific measurement frequency selected from the predetermined measurement frequency, and the ECU 60 can be configured to ascertain the parameters, such as the SOH, of the selected battery cell 42 in accordance with how the measured values of the complex impedance of the selected battery cell 42 for the at least one specific measurement frequency are changed over time.

Ensuring a sufficient level of complex-impedance measurement accuracy for a selected battery cell 42 requires averaging, i.e., integrating, measured voltage variations for each measurement frequency to accordingly reduce errors included in the measured voltage variations. This requirement therefore needs (i) output of the alternating signals, each of which has a certain wavenumber, from the selected battery cell 42, and (ii) measurement of a variation of the voltage across the selected battery cell 42 for each of the alternating signals during an output period of the corresponding one of the alternating signals.

A predetermined necessary level of the complex-impedance measurement accuracy for any battery cell 42 requires, for each measurement frequency, output of the corresponding alternating current that has a sufficient wavenumber determined to satisfy the predetermined necessary level of the complex-impedance measurement accuracy. The predetermined measurement frequencies, which are different from each other, cause the respective alternating signals to have different wavenumbers per unit time.

A low measurement frequency may require a longer output period of an alternating signal, which has the corresponding low measurement frequency, as compared with an output period of an alternating signal, which has a higher measurement frequency.

That is, there is a matter that output periods required for the respective measurement frequencies are different from one another.

This matter may cause the following issue when the alternating signals for each measurement frequency is combined with one another to generate a composite wave signal as an alternating current.

Specifically, if the output periods of all the composite wave signals for all the measurement frequencies were set to be in conformity with a value of the output period of the composite wave signal for the lowest measurement frequency, the output periods of all the composite wave signals for all the measurement frequencies would become longer. This would therefore result in the higher measurement frequency composite wave signals than the lowest-frequency composite wave signal being each outputted for an unnecessary long time, resulting in a reduction in complex-impedance measurement efficiency.

From this viewpoint, the battery measurement apparatus 50 according to the first embodiment is configured set forth below.

Figure 3:
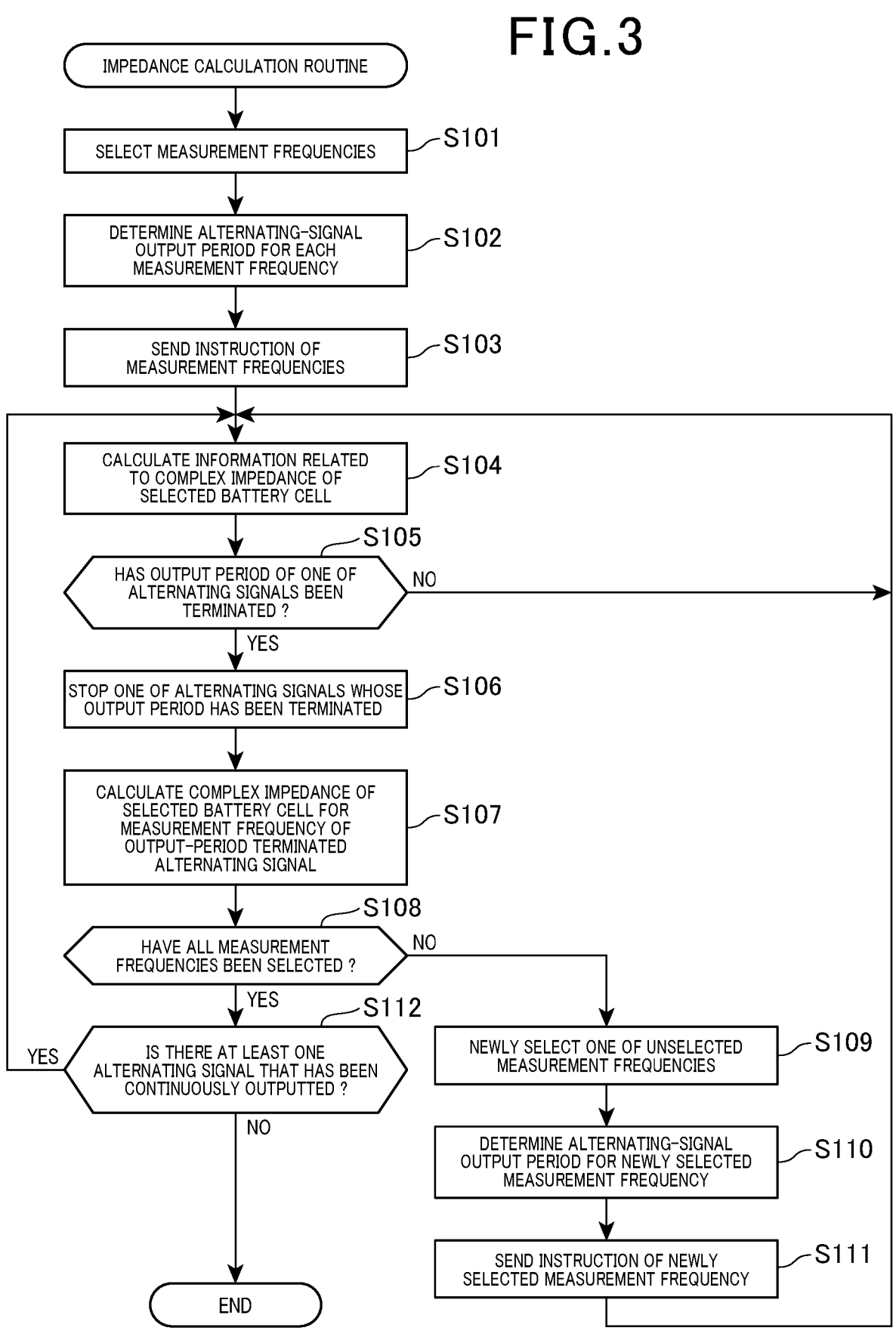
FIG. 3 is a flowchart illustrating an impedance calculation routine according to the first embodiment.

The following describes an impedance calculation routine carried out by the battery measurement apparatus 50 with reference to FIG. 3.

The processing unit 54 is configured to execute the impedance calculation routine illustrated in FIG. 3 at one or more predetermined times. The predetermined times include a time when the vehicle is activated, any time during the vehicle being stopped, and/or a specified time of a day or week. The predetermined times can include any time during the vehicle being traveling.

When starting the impedance calculation routine, the processing unit 54 performs a selection cycle of selecting a single or plural measurement frequencies from the measurement frequencies for complex-impedance measurement of a selected battery cell 42 in step S101. Specifically, the processing unit 54 according to the first embodiment selects two measurement frequencies from the measurement frequencies previously determined within a predetermined measurement range in step S101.

In particular, the processing unit 54 selects two measurement frequencies from the previously determined measurement frequencies while preventing one of the selected two measurement frequencies from becoming an integral multiple of the other thereof. Alternatively, the processing unit 54 adjusts one of the selected two measurement frequencies to be slightly offset from an integral multiple of the other thereof. This specific selection aims to prevent the impedance calculation routine from having an adverse effect from harmonic wave components of the other of the selected two measurement frequencies.

In step S101, the processing unit 54 does not need to select plural, i.e., two, measurement frequencies from the previously determined measurement frequencies, and can select a single measurement frequency when the single measurement frequency only lies within the predetermined measurement range.

Next, the processing unit 54 determines, for each of the selected two measurement frequencies, an alternating-signal output period in step S102. When selecting the two measurement frequencies from the previously determined measurement frequencies, the processing unit 54 determines an output period of a first output signal for one of the selected two measurement frequencies, and an output period of a second output signal for the other of the selected two measurement frequencies. The output period determined for each of the selected two measurement frequencies represents an output period during which a predetermined wavenumber, i.e., the number of waves, of an output signal having the corresponding one of the selected two measurement frequencies have been outputted. That is, the output period for each of the selected two measurement frequencies can be determined based on the corresponding one of the selected two measurement frequencies. The predetermined wavenumber, i.e., the number of waves, of the output signal for each of the selected two measurement frequencies can be previously determined based on a required level of impedance-measurement accuracy.

Next, the processing unit 54 for example sends, to the modulation signal generator 53, instruction of the selected two measurement frequencies in step S103.

Specifically, when the processing unit 54 sends, to the modulation signal generator 53, an instruction of the selected two measurement frequencies, the modulation signal generator 53 causes the first and second oscillators 53a and 53b to generate, based on the selected two measurement frequencies, analog first and second alternating signals that have the selected two measurement frequencies, respectively. Then, the modulation signal generator 53 superimposes one of the analog first and second alternating signals on the other thereof to accordingly generate an analog composite wave signal. Alternatively, when the processing unit 54 sends, to the modulation signal generator 53, an instruction of the selected single measurement frequency, the modulation signal generator 53 causes the first oscillator 53a or the second oscillator 53b to generate, based on the selected single measurement frequency, an analog first/second alternating signal that has the selected single measurement frequency.

Then, the modulation signal generator 53 converts the analog composite wave signal or the analog first/second alternating signal into a digital composite wave signal or a digital first/second alternating signal. Then, the modulation signal generator 53 sends, to the alternating-current generator 51, the digital composite wave signal or the digital first/second alternating signal as an instruction signal.

The alternating-current generator 51 causes the selected battery cell 42 to output an alternating current based on the instruction signal, i.e., the digital composite-wave signal or the digital first/second alternating signal.

The voltage-response measurement unit 52 measures the voltage across the selected battery cell 42 to accordingly measure a variation in the voltage across the selected battery cell 42 as a response signal. Then, the voltage-response measurement unit 52 outputs the measured response signal to the processing unit 54.

When receiving the response signal from the voltage-response measurement unit 52, the processing unit 54 calculates, based on the response signal, an information item related to the complex impedance of the selected battery cell 42 for the selected single or two measurement frequencies in step S104.

The following describes specific operations in step S104.

Specifically, the processing unit 54 performs a measurement of the alternating current to accordingly retrieve, from the alternating current, the combination of the first and second alternating signals or the first/second alternating signal. That is, the processing unit 54 measures the alternating current flowing through the first current path 81, and analyzes the measured alternating current based on the frequency of the alternating current to accordingly extract, from the alternating current, the combined first and second alternating signals or the first/second alternating signal. The processing unit 54 can directly retrieve, from the modulation signal generator 53, the combined first and second alternating signals or the first/second alternating signal.

Then, the processing unit 54 performs, based on the retrieved first and second alternating signals (or the retrieved first/second alternating signal), an analysis of the response signal to accordingly calculate, as the information item related to the complex impedance of the selected battery cell

42, a real-part proportional value and an imaginary-part proportional value; the real-part proportional value is proportional to a real part of the response signal, and the imaginary-part proportional value is proportional to an imaginary part of the response signal.

The real-part proportional value represents an average value or an integrated value of the real parts of the respective response signals, i.e., the variations in the voltage across the selected battery cell 42, obtained during the output period of the combined first and second alternating signals or the first/second alternating signal.

Next, the processing unit 54 determines whether the output period of one of the combined first and second alternating signals or the first/second alternating signal has been terminated in step S105. In response to determination that the output period of each of the combined first and second alternating signals or the first/second alternating signal has not been terminated (NO in step S105), the processing unit 54 returns to the operation in step S104, and continuously iterates the measurement and the analysis in step S104 and the determination in step S105 set forth above.

Otherwise, in response to determination that the output period of one of the combined first and second alternating signals or the first/second alternating signal has been terminated (YES in step S105), the processing unit 54 instructs the modulation signal generator 53 to stop generation of one of the first and second alternating signals (or the first/second alternating signal) whose output period has been terminated in step S106. If there is at least one alternating signal, i.e., the other of the first and second alternating signals, whose output period has not been terminated, the modulation signal generator 53 continues generation of the at least one alternating signal and generation of the instruction signal based on the at least one alternating signal, and thereafter sends the instruction signal to the alternating-current generator 51 until generation of a new alternating current signal is instructed.

The processing unit 54 obtains the real-part proportional value and the imaginary-part proportional value of (i) one of the combined first and second alternating signals, the output period of which has been terminated, or (ii) the first/second alternating signal whose output period has been terminated in step S107. One of the combined first and second alternating signals, the output period of which has been terminated, or the first/second alternating signal whose output period has been terminated will be referred to as an output-period terminated alternating signal hereinafter.

Then, the processing unit 54 calculates, based on the real-part proportional value and the imaginary-part proportional value of the output-period terminated alternating signal, at least one of an absolute value and a phase of the complex impedance for the measurement frequency of the output-period terminated alternating signal in step S107. Then, the processing unit 54 sends, to the ECU 60, at least one of the absolute value and the phase of the complex impedance for measurement frequency of the output-period terminated alternating signal in step S107.

Following the operation in step S107, the processing unit 54 determines whether all the measurement frequencies previously determined within the predetermined measurement range have been selected in step S108. That is, the processing unit 54 determines whether the absolute value and/or the phase of the complex impedance of the selected battery cell 42 for each of the measurement frequencies within the predetermined measurement range have been calculated in step S108.

In response to determination that one or more measurement frequencies have not been selected yet (NO in step S108), the processing unit 54 performs a next selection cycle of newly selecting one of the one or more unselected measurement frequencies in step S109. When newly selecting one of the one or more unselected measurement frequencies, the processing unit 54 prevents the newly selected measurement frequency from becoming an integral multiple of the measurement frequency of the continuously outputted alternating signal, or adjusts the newly selected measurement frequency to be slightly offset from an integral multiple of the continuously outputted alternating signal in step S109.

The processing unit 54 determines an alternating-signal output period for the newly selected measurement frequency in step S110, which is carried out similarly to the operation in step S102.

Next, the processing unit 54 sends, to the modulation signal generator 53, an instruction of the newly selected measurement frequency at a predetermined time in step S111. The predetermined time represents a time at which a predetermined period has elapsed since the end of the output period of one of the first and second alternating signals.

Specifically, when the processing unit 54 sends, to the modulation signal generator 53, an instruction of the newly selected measurement frequency, the modulation signal generator 53 receives the newly selected measurement frequency. Then, the modulation signal generator 53 causes one of the first and second oscillators 53a and 53b, which is not outputting any alternating signal, to generate, based on the newly selected measurement frequency, an analog alternating signal that has the newly selected measurement frequency.

Then, the modulation signal generator 53 superimposes one of the analog signals outputted from the respective first and second oscillators 53a and 53b on the other thereof to accordingly generate an analog composite wave signal.

Thereafter, the modulation signal generator 53 converts the analog composite wave signal into a digital composite wave signal. Then, the modulation signal generator 53 sends, to the alternating-current generator 51, the digital composite wave signal as an instruction signal.

The alternating-current generator 51 causes the selected battery cell 42 to output an alternating current based on the instruction signal, i.e., the digital composite-wave signal.

The voltage-response measurement unit 52 measures the voltage across the selected battery cell 42 to accordingly measure a variation in the voltage across the selected battery cell 42 as a response signal. Then, the voltage-response measurement unit 52 outputs the measured response signal to the processing unit 54.

When receiving the response signal from the voltage-response measurement unit 52, the processing unit 54 returns to step S104, and calculates, based on the response signal, an information item related to the complex impedance of the selected battery cell 42 in step S104.

After executing the operations in step S105 to S107 subsequently from the operation in step S104, the processing unit 54 determines whether all the measurement frequencies previously determined within the predetermined measurement range have been selected in step S108.

In response to determination that one or more measurement frequencies have not been selected yet (NO in step S108), the processing unit 54 performs a next selection cycle of newly selecting one of the one or more unselected measurement frequencies in step S109, and thereafter iterates the operations in steps S110, S111, and S104 to S109 set forth above.

Otherwise, in response to determination that all the measurement frequencies previously determined within the predetermined measurement range have been selected (YES in step S108), the processing unit 54 determines whether there is at least one alternating signal that has been continuously outputted by the modulation signal generator 53, in other words, there is at least one alternating signal whose output period has not been terminated in step S112.

In response to determination that there is a remaining alternating signal that has been continuously generated by the modulation signal generator 53 (YES in step S112), the processing unit 54 returns to step S104, and calculates an information item related to the complex impedance of the selected battery cell 42 in step S104.

Otherwise, in response to determination that there are no alternating signals that have been continuously generated by the modulation signal generator 53 (NO in step S112), the processing unit 54 determines that calculation of the information items on all the measurement frequencies has completed, thus terminating the impedance calculation routine.

As described above, the processing unit 54 serves as a current controller 54a that causes a rechargeable battery, such as the selected battery cell 42, to output a composite wave signal comprised of plural alternating signals having different frequencies; one of the alternating signals is superimposed on the other thereof.

The processing unit 54 additionally serves as a calculator 54b that performs, as a battery measurement method, an impedance calculation method of analyzing a variation in the voltage across the rechargeable battery for each of the different-frequency alternating signals to accordingly calculate information on the complex impedance of the rechargeable battery.

The operations in steps S101 to S103 and S109 to S111 serve as a current control step, and the operation in step S104 serves as a voltage measurement step.

The following describes how the battery measurement apparatus 50 configured set forth above operates.

Determining the output period and output time for each of alternating signals that constitute a composite wave signal results in the output signals, which constitute the composite wave signal, being outputted from the respective first and second oscillators 53a and 53b.

Figure 4:
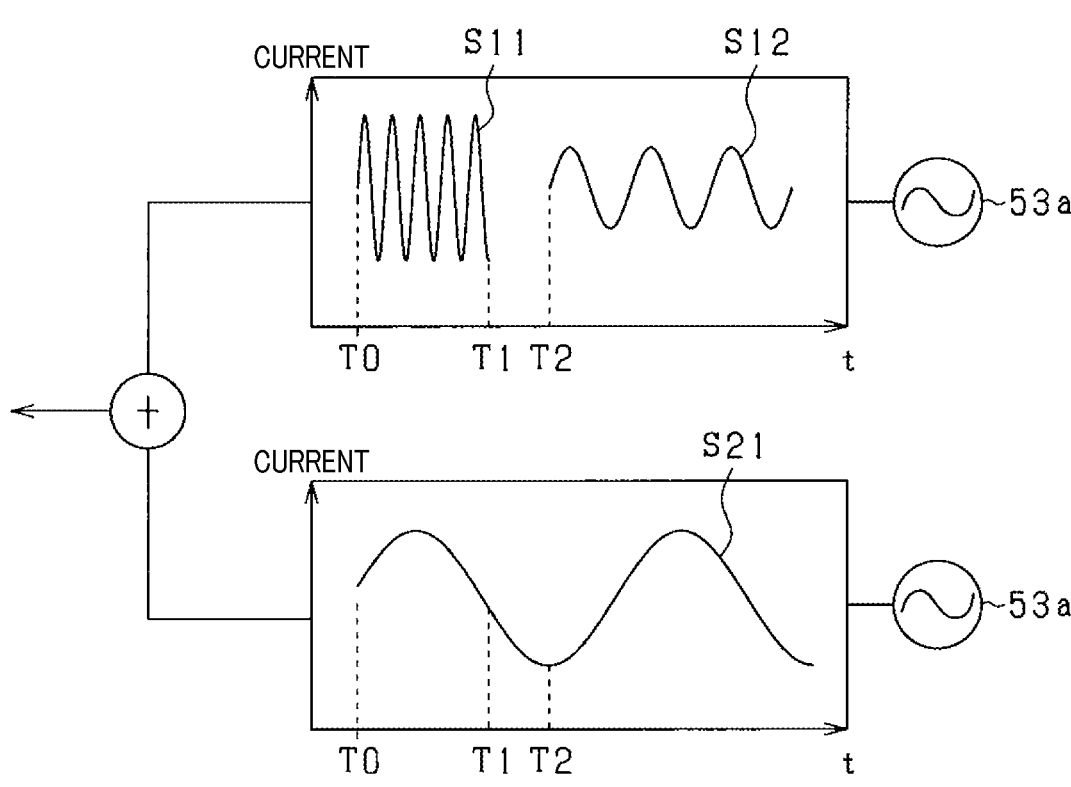
FIG. 4 is a timing chart illustrating waveforms of respective alternating signals, which constitute a composite wave signal.

Specifically, FIG. 4 illustrates an example of the first alternating signal, to which reference character S11 is assigned, outputted at time T0 from the first oscillator 53a and an example of the second alternating signal, to which reference character S21 is assigned, outputted at the time T0 from the second oscillator 53b; the measurement frequency of the first alternating signal S11 is higher than that of the second alternating signal S21.

The measurement frequency of the first alternating signal S11 is higher than that of the second alternating signal S21. For this reason, the output period of the first alternating signal S11, i.e., the output period until which a predetermined required wavenumber of the first alternating signal S11 has been outputted, is shorter than the output period of the second alternating signal S21, i.e., the output period until which a predetermined required wavenumber of the second alternating signal S21 has been outputted.

This results in, as illustrated in FIG. 4, if the composite wave signal based on the first and second alternating signals S11 and S21 is outputted as an alternating current from the time T0, the output period of the first alternating signal S11 being terminated earlier than the output period of the second alternating signal S21. That is, the output period of the first alternating signal S11 is terminated at time T1 while the second alternating signal S21 is continuously outputted.

Until the predetermined period has elapsed since the time T1, the second alternating signal S21 is only continuously outputted from the second oscillator 53b, so that the second alternating signal S21 is outputted as an alternating current. When the predetermined period has elapsed since the time T1, a new first alternating signal S12 is generated by the first oscillator 53a and outputted therefrom at time T2.

After the time T2, a composite wave signal based on the new first alternating signal S12 and the second alternating signal S21 is outputted as an alternating current.

The first embodiment set forth above achieves the following advantageous benefits.

The processing unit 54 is configured to instruct the modulation signal generator 53 to output, for example, at least two alternating signals that respectively have (i) predetermined wavenumbers and (ii) different measurement frequencies.

Additionally, when determining that the predetermined wavenumber of one of the at least two alternating signals, which constitute a composite wave signal, has completed, the processing unit 54 switches, through the modulation signal generator 53, the completed one of the at least two alternating signals to a new alternating signal having another measurement frequency while continuing an output of the other of the at least two alternating signals.

For example, as illustrated in FIG. 4, when determining that the predetermined wavenumber of the first alternating signal S11 with a predetermined measurement frequency has completed, the processing unit 54 switches, through the modulation signal generator 53, the completed first alternating signal S11, which constitutes a composite wave signal together with the second alternating signal S21, to a new first alternating signal S12 having another measurement frequency while continuing an output of the second alternating signal S21 with a predetermined measurement frequency lower than that of the first alternating signal S11.

This makes it possible to, after the output period of the first alternating signal S11, superimpose the new first alternating signal S12, which has another measurement frequency, on the second alternating signal S21 without waiting for termination of the output period of the second alternating signal S21 to accordingly output a new composite wave signal based on the combination of the new first alternating signal S12 and the second alternating signal S21 as an alternating current.

This configuration therefore enables measurement of the complex impedance of each battery cell 42 with higher efficiency as compared with a comparative example where a new composite wave signal is outputted after termination of the output period of the second alternating signal S21 with the lower measurement frequency.

Additionally, the above configuration of the battery measurement apparatus 50, which instructs the modulation signal generator 53 to output, for example, at least two alternating signals that respectively have (i) predetermined wavenumbers and (ii) different measurement frequencies, makes it possible to maintain the calculation accuracy of the complex impedance of each selected battery cell 42.

The processing unit 54 is configured to select at least two of the previously determined measurement frequencies while preventing one of the at least two measurement frequencies from becoming an integral multiple of another one of the at least two measurement frequencies. This therefore prohibits any one of the measurement frequencies or its integral multiple from coinciding with any other of the measurement frequencies or its integral multiple, making it possible to prevent an amplitude of each generated alternating current from increasing incorrectly.

Second Embodiment

The configuration disclosed in the first embodiment can be modified as the following configuration of the second embodiment.

Specifically, the following mainly describes different points of the second embodiment from the first embodiment.

The second embodiment for example includes, as its basic structure, the power supply system 10 according to the first embodiment.

Figure 5:
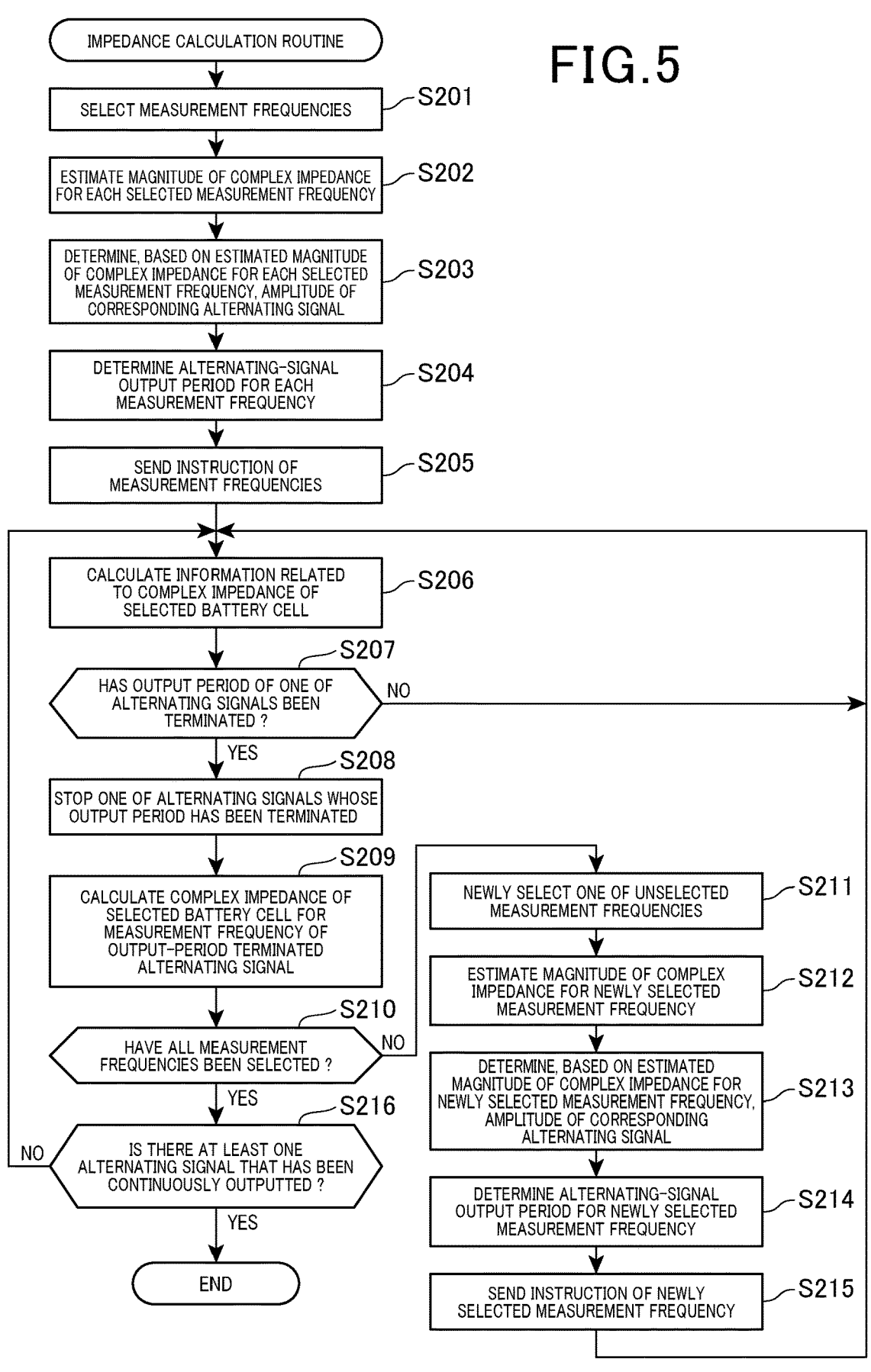
FIG. 5 is a flowchart illustrating an impedance calculation routine according to the second embodiment.

The following describes an impedance calculation routine carried out by the battery measurement apparatus 50 according to the second embodiment with reference to FIG. 5.

When starting the impedance calculation routine of the second embodiment, the processing unit 54 performs, like the operation in step S101, a selection cycle of selecting, for example, plural measurement frequencies, i.e., two measurement frequencies, from the measurement frequencies for complex-impedance measurement of a selected battery cell 42 in step S201.

Next, the processing unit 54 refers to, for example, a history of the previously measured values, i.e., measured complex numbers, of the complex impedance of the selected battery cell 42 for the respective selected two measurement frequencies; the history is stored in the storage thereof. As a result of the reference, the processing unit 54 estimates a magnitude of the complex impedance for each of the selected two measurement frequencies in step S202.

For example, in the storage of the processing unit 54, a map is stored; the map represents the Cole-Cole plot representing how the calculated complex numbers of the complex impedance of the selected battery cell 42 vary with variation of the measurement frequencies. At that time, the processing unit 54 refers to the map to accordingly calculate an estimated magnitude, which is an absolute value, of the complex impedance for each of the selected two measurement frequencies in step S202. That is, the processing unit 54 serves an estimator that estimates the magnitude of the complex impedance of the selected battery cell 42 for each of the selected two measurement frequencies.

Next, the processing unit 54 sets, based on the estimated magnitude of the complex impedance of the selected battery cell 42 for each of the selected two measurement frequencies, an amplitude of a corresponding one of a first alternating signal and a second alternating signal in step S203.

For example, the processing unit 54 sets the amplitude of each of the first and second alternating signals to be higher than a usual amplitude range thereof when the estimated magnitude of a corresponding one of the selected two measurement frequencies is lower than a usual magnitude range. This makes it possible to increase a variation in the voltage across the selected battery cell 42 to accordingly improve the complex-impedance measurement accuracy.

Figure 6:
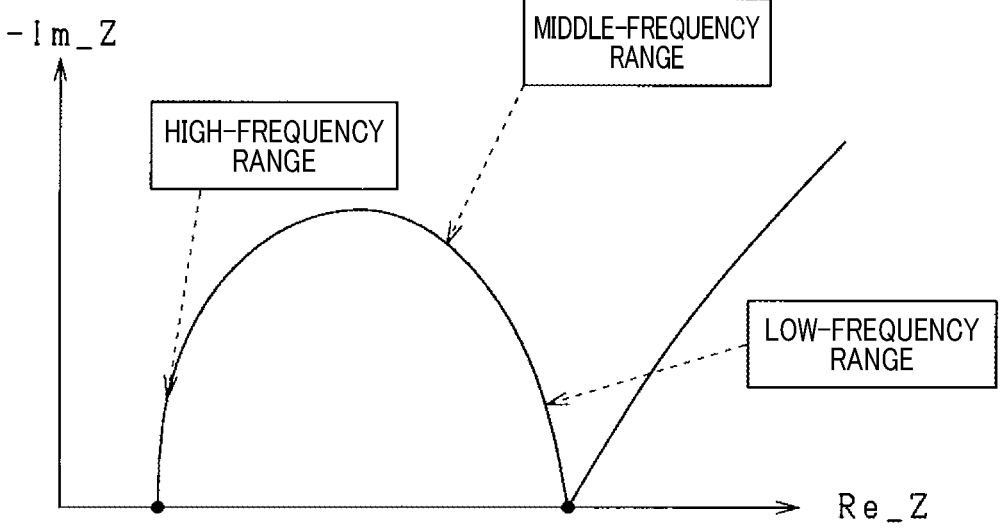
FIG. 6 is a graph illustrating an example of a Cole-Cole plot.

For example, FIG. 6 illustrates that the measurement frequencies are categorized into a low-frequency range, such as tens of hertz or below, a middle-frequency range (in other words, the usual frequency range), such as hundreds of hertz, higher than the low-frequency range, and a high-frequency range, such as several kilohertz or above, higher than the middle-frequency range.

If each of the selected two measurement frequencies is within the high-frequency range or the low-frequency range, the processing unit 54 sets the amplitude of each of the first and second alternating signals to be higher than the usual amplitude range suitable for the middle-frequency range. This is because the estimated magnitude of the complex impedance for each of selected two measurement frequencies within the low-frequency or high-frequency range is lower than the usual magnitude range.

Otherwise, if each of the selected two measurement frequencies is within the middle-frequency range, the processing unit 54 sets the amplitude of each of the first and second alternating signals to be within the usual magnitude range suitable for the middle-frequency range. This is because the estimated magnitude of the complex impedance for each of selected two measurement frequencies within the middle-frequency range lies within the usual magnitude range.

When setting the amplitude of each of the first and second alternating signals, the processing unit 54 adjusts the amplitude of each of the first and second alternating signals while the amplitude of the composite wave signal based on the combination of the first and second alternating signals is within a predetermined amplitude range. Specifically, the processing unit 54 determines, based on the DC bias superimposed on the composite signal, the amplitude of each of the first and second alternating signals while (i) a local maximum value, i.e., a maximum instantaneous value, of the composite signal, i.e., the corresponding alternating current, is lower than or equal to a predetermined maximum current value, and (ii) a local minimum value, i.e., a minimum instantaneous value, of the composite signal, i.e., the corresponding alternating current, is higher than or equal to a predetermined minimum current value. As the predetermined maximum current value, a rated current determined for the battery cells 42 can be used.

The processing unit 54 determines, like the operation in step S102, for each of the selected two measurement frequencies, an alternating-signal output period in step S204. Next, the processing unit 54 sends, to the modulation signal generator 53, parameters including each of the two measurement frequencies selected in step S202 and the amplitude for each of the two measurement frequencies set in step S203 in step S205. The modulation signal generator 53 causes each of the first and second oscillators 53*a* and 53*b* to generate, based on a corresponding one of the selected two measurement frequencies and the corresponding determined amplitude, a corresponding one of analog first and second alternating signals; each of the analog first and second alternating signals has the corresponding one of the selected two measurement frequencies and the corresponding determined amplitude.

Then, the modulation signal generator 53 superimposes one of the analog first and second alternating signals on the other thereof to accordingly generate an analog composite wave signal.

Alternatively, if the single measurement frequency is selected in step S201, the processing unit 54 sends, to the modulation signal generator 53, parameters including the selected single measurement frequency and the determined amplitude. The modulation signal generator 53 causes one of the first and second oscillators 53*a* and 53*b* to generate, based on the selected single measurement frequency and the amplitude, an analog first/second alternating signal that has the selected single measurement frequency and the determined amplitude.

Then, the modulation signal generator 53 converts the analog composite wave signal or the analog first/second alternating signal into a digital composite wave signal or a digital first/second alternating signal. Then, the modulation signal generator 53 sends, to the alternating-current generator 51, the digital composite wave signal or the digital first/second alternating signal as an instruction signal.

The alternating-current generator 51 causes the selected battery cell 42 to output an alternating current based on the instruction signal, i.e., the digital composite-wave signal or the digital first/second alternating signal.

The voltage-response measurement unit 52 measures the voltage across the selected battery cell 42 to accordingly measure a variation in the voltage across the selected battery cell 42 as a response signal. Then, the voltage-response measurement unit 52 outputs the measured response signal to the processing unit 54.

The alternating-current generator 51 causes the selected battery cell 42 to output an alternating current based on the instruction signal, i.e., the digital composite-wave signal or the digital first/second alternating signal.

The voltage-response measurement unit 52 measures the voltage across the selected battery cell 42 to accordingly measure a variation in the voltage across the selected battery cell 42 as a response signal. Then, the voltage-response measurement unit 52 outputs the measured response signal to the processing unit 54.

The following operations in steps S206 to S211 and S216 are substantially identical to the above respective operations in steps S104 to S109 and S112, and therefore, detailed descriptions of which are omitted.

When newly selecting one of the one or more unselected measurement frequencies in step S211, the processing unit 54 estimates, like the operation in step S202, a magnitude of the complex impedance of the selected battery cell 42 for the newly selected measurement frequency in step S212. Next, like the operation in step S203, the processing unit 54 sets, based on the estimated magnitude of the complex impedance of the selected battery cell 42 for the newly selected measurement frequency, an amplitude of an alternating signal in step S213.

Following the operation in step S213, the processing unit 54 determines an alternating-signal output period for the newly selected measurement frequency in step S214. Next, the processing unit 54 sends, to the modulation signal generator 53, an instruction of the newly selected measurement frequency and the determined amplitude at a predetermined time in step S215. The predetermined time represents a time at which a predetermined period has elapsed since the end of the output period of one of the first and second alternating signals.

The modulation signal generator 53 causes one of the first and second oscillators 53*a* and 53*b*, which is not outputting any alternating signal, to generate, based on the newly selected measurement frequency and the determined amplitude, an analog alternating signal that has the newly selected measurement frequency and the determined amplitude.

Then, the modulation signal generator 53 superimposes one of the analog signals outputted from the respective first and second oscillators 53*a* and 53*b* on the other thereof to accordingly generate an analog composite wave signal.

Thereafter, the modulation signal generator 53 converts the analog composite wave signal into a digital composite wave signal. Then, the modulation signal generator 53 sends, to the alternating-current generator 51, the digital composite wave signal as an instruction signal.

The alternating-current generator 51 causes the selected battery cell 42 to output an alternating current based on the instruction signal, i.e., the digital composite-wave signal.

The voltage-response measurement unit 52 measures the voltage across the selected battery cell 42 to accordingly measure a variation in the voltage across the selected battery cell 42 as a response signal. Then, the voltage-response measurement unit 52 outputs the measured response signal to the processing unit 54.

When receiving the response signal from the voltage-response measurement unit 52, the processing unit 54 returns to step S206, and calculates, based on the response signal, an information item related to the complex impedance of the selected battery cell 42 in step S206.

The second embodiment set forth above achieves the following advantageous benefits.

The processing unit 54 is configured to estimate a magnitude of the complex impedance for each of selected at least two measurement frequencies. The processing unit 54 is additionally configured to set, based on the estimated magnitude of the complex impedance of the selected battery cell 42 for each of the selected at least two measurement frequencies, an amplitude of a corresponding one of at least two alternating signals. Specifically, the processing unit 54 is configured to increase the amplitude of each of the at least two alternating signals when the estimated magnitude of the complex impedance of the selected battery cell 42 is relatively low, or decrease the amplitude of each of the at least two alternating signals when the estimated magnitude of the complex impedance of the selected battery cell 42 is relatively high.

This makes it possible to increase, when the magnitude of the complex impedance is estimated to be relatively low, a variation in the voltage across the selected battery cell 42 to accordingly improve the complex-impedance measurement accuracy even if the magnitude of the complex impedance is estimated to be relatively low.

The processing unit 54 is configured to adjust the amplitude of each of the first and second alternating signals while the amplitude of the composite wave signal based on the combination of the first and second alternating signals is within the predetermined amplitude range. Specifically, the processing unit 54 is configured to determine, based on the DC bias superimposed on the composite signal, the amplitude of each of the first and second alternating signals while (i) a local maximum value, i.e., a maximum instantaneous value, of the composite signal, i.e., the corresponding alternating current, is lower than or equal to the predetermined maximum current value, and (ii) a local minimum value, i.e., a minimum instantaneous value, of the composite signal, i.e., the corresponding alternating current, is higher than or equal to the predetermined minimum current value.

This configuration makes it possible to prevent the alternating current, i.e., a discharge current, based on composite wave signal, outputted from the selected battery cell 42 from varying widely, thus prohibiting:

(I) A large level of current, which exceeds the rated current determined for the battery cells 42, from being outputted from the selected battery cell 42, and (II) An adverse effect on the various states of the selected battery cell 42, such as the complex impedance, voltage, and/or the SOC, due to the wide variations of the alternating current outputted from the selected battery cell 42.

Third Embodiment

The configuration disclosed in the first embodiment can be modified as the following configuration of the third embodiment.

Specifically, the following mainly describes different points of the third embodiment from the first or second embodiment.

The third embodiment for example includes, as its basic structure, the power supply system 10 according to the second embodiment.

The measurement range of the measurement frequencies, which is required to create a Cole-Cole plot used to obtain necessary information items about each battery cell 42, such as a reaction resistance and/or an ohmic resistance, may become a wide range between tens of hertz and several kilohertz. For this reason, when a low-frequency alternating signal and a high-frequency alternating signal are superimposed on one another, there may be a case where the output period of the high-frequency alternating signal is lower than or equal to the half period of the low-frequency alternating signal.

Figure 7A:
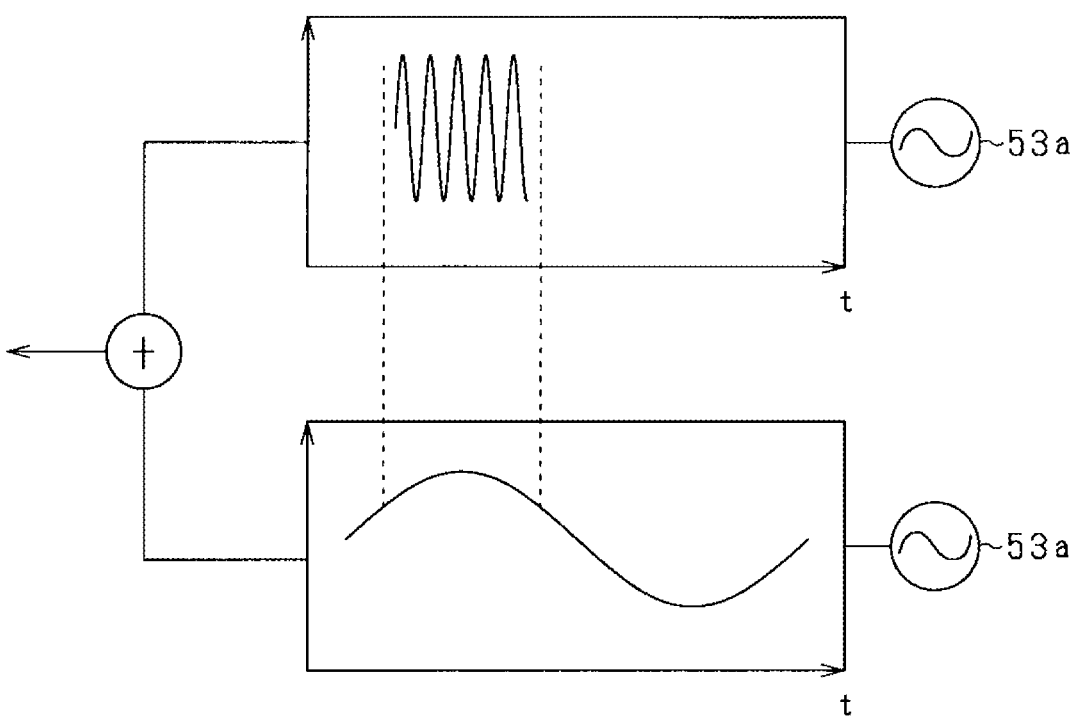
FIGS. 7A and 7B are each a timing chart illustrating waveforms of respective alternating signals, which constitute a composite wave signal according to a comparative example.
Figure 7B:
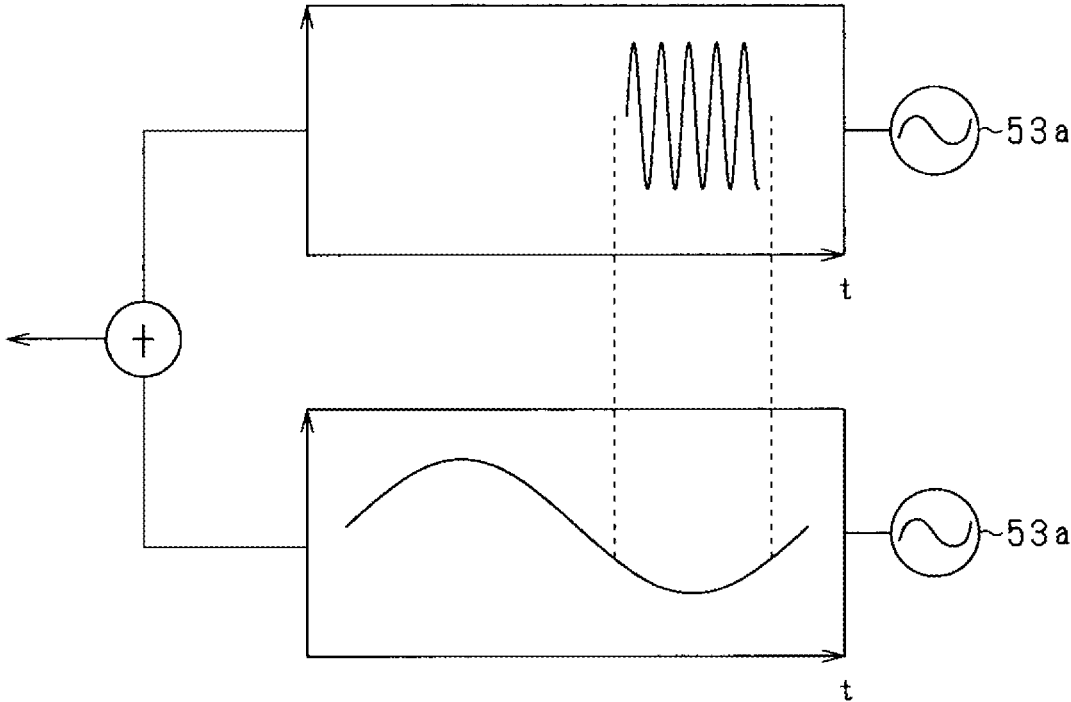

As illustrated in FIG. 7A, superimposing a high-frequency alternating signal on a low-frequency alternating signal while instantaneous values of the low-frequency alternating signal are relatively high may result in corresponding maximum instantaneous values of the superimposed composite signal becoming higher. In contrast, as illustrated in FIG. 7B, superimposing a high-frequency alternating signal on a low-frequency alternating signal while instantaneous values of the low-frequency alternating signal are relatively low may result in corresponding minimum instantaneous values of the superimposed composite signal becoming lower.

That is, depending on the output timing of the high-frequency alternating signal, increase and decrease timing of the instantaneous values of the alternating current outputted from each battery cell 42 based on the composite wave signal may be biased, resulting in the alternating current outputted from each battery cell 42 varying widely. This may cause an adverse effect on the various states of each battery cell 42.

For addressing such an issue, the battery measurement apparatus 50 according to the third embodiment is configured to address such an issue described hereinafter.

When instructing the modulation signal generator 53 to superimpose the alternating signal on one another, the processing unit 54 is configured to determine whether the output period of one of the alternating signals, which is higher in frequency than any other alternating signal(s), is smaller than half the cycle of any one of the other alternating signal(s).

For example, when instructing the modulation signal generator 53 to superimpose the first and second alternating signal on one another, the processing unit 54 is configured to determine whether the output period of one of the first and second alternating signals, which is higher in frequency than the other thereof, is smaller than half the cycle of the other of the first and second alternating signals.

One of the first and second alternating signals, which is higher in frequency than the other thereof, will be referred to as a high-frequency alternating signal, and the other thereof will be referred to as a low-frequency alternating signal.

In response to affirmative determination that the output period of the high-frequency alternating signal is small than half the cycle of the low-frequency alternating signal, the processing unit 54 is configured to adjust the start timing of outputting the high-frequency alternating signal such that the output period of the high-frequency alternating signal matches a period of the low-frequency alternating signal during which instantaneous values thereof, i.e., displacements thereof relative to the average, are closer to the average of the low-frequency alternating signal than to the maximum or minimum of the low-frequency alternating signal.

More specifically, the processing unit 54 is configured to adjust the start timing of outputting the high-frequency alternating signal such that the midpoint of the output period of the high-frequency alternating signal matches $n\pi$ (n is any natural integer) of the low-frequency alternating signal.

Figure 8:
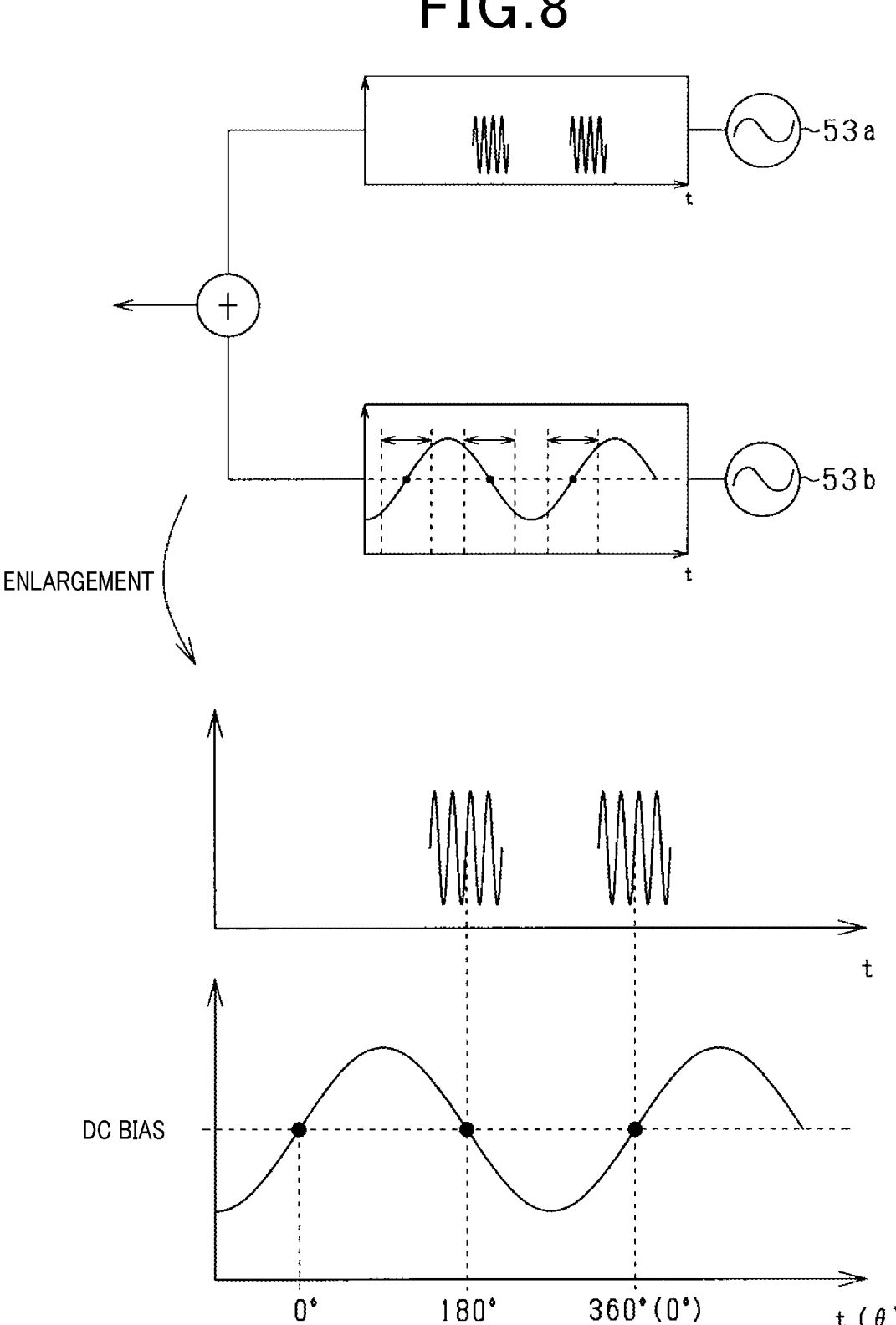
FIG. 8 is a timing chart illustrating waveforms of respective alternating signals, which constitute a composite wave signal according to the third embodiment.

That is, the processing unit 54 is configured to, as illustrated in FIG. 8, determine the output period of the high-frequency alternating signal such that the midpoint of the output period of the high-frequency alternating signal matches a point of the low-frequency alternating signal at which its displacement zero, i.e., its instantaneous value is in agreement with the average of the low-frequency alternating signal.

This configuration enables (I) On half of the output period of the high-frequency alternating signal overlaps a positive period of the low-frequency signal relative to the average, i.e., the DC bias (II) The other half of the output period of the high-frequency alternating signal overlaps a negative period of the low-frequency signal relative to the average, i.e., the DC bias (III) The output period of the high-frequency alternating signal to overlap a relatively low-displacement period of the low-frequency alternating signal The third embodiment set forth above achieves the following advantageous benefits.

The processing unit 54 is configured to adjust the start timing of outputting the high-frequency alternating signal such that the output period of the high-frequency alternating signal matches a period of the low-frequency alternating signal during which instantaneous values thereof, i.e., displacements thereof relative to the average, are closer to the average of the low-frequency alternating signal than to the maximum or minimum of the low-frequency alternating signal.

This configuration reduces a biased increase or biased decrease of the alternating current outputted from each battery cell 42 as compared with a comparative example where the output period of the high-frequency alternating signal is set to be closer to the maximum or minimum of the low-frequency alternating signal than to the average of the low-frequency alternating signal. This therefore makes it possible to reduce an adverse effect due to the biased change of the alternating current on the various states of each battery cell 42.

Modification of Third Embodiment

The processing unit 54 of the third embodiment can be configured to set the output period of the high-frequency alternating signal at a phase period when the phase, referred to as $\theta$, of the low-frequency alternating signal satisfies one of the following formulas:

$$0° \le \theta \le 45° \qquad\qquad (I)$$

$$135° \le \theta \le 225° \qquad\qquad (II)$$

$$315° \le \theta \le 360° \qquad\qquad (III)$$

That is, assuming that each of the high- and low-frequency alternating signals is a sinusoidal alternating signal with no DC bias, the output period of the high-frequency alternating signal can be set to a period during which instantaneous values, i.e., displacements, of the low-frequency alternating signal are lower than or equal to the amplitude of the low-frequency alternating signal.

Other Modifications

The processing unit 54 of each of the above-mentioned embodiments can use any impedance calculation method, such as a known lock-in detection, a known heterodyne measurement method, or a known Fourier transform measurement method, of analyzing a variation in the voltage across a rechargeable battery for each of the different-frequency alternating signals to accordingly calculate information items, such as the amplitude and/or phase, on the complex impedance of the rechargeable battery.

Figure 9:
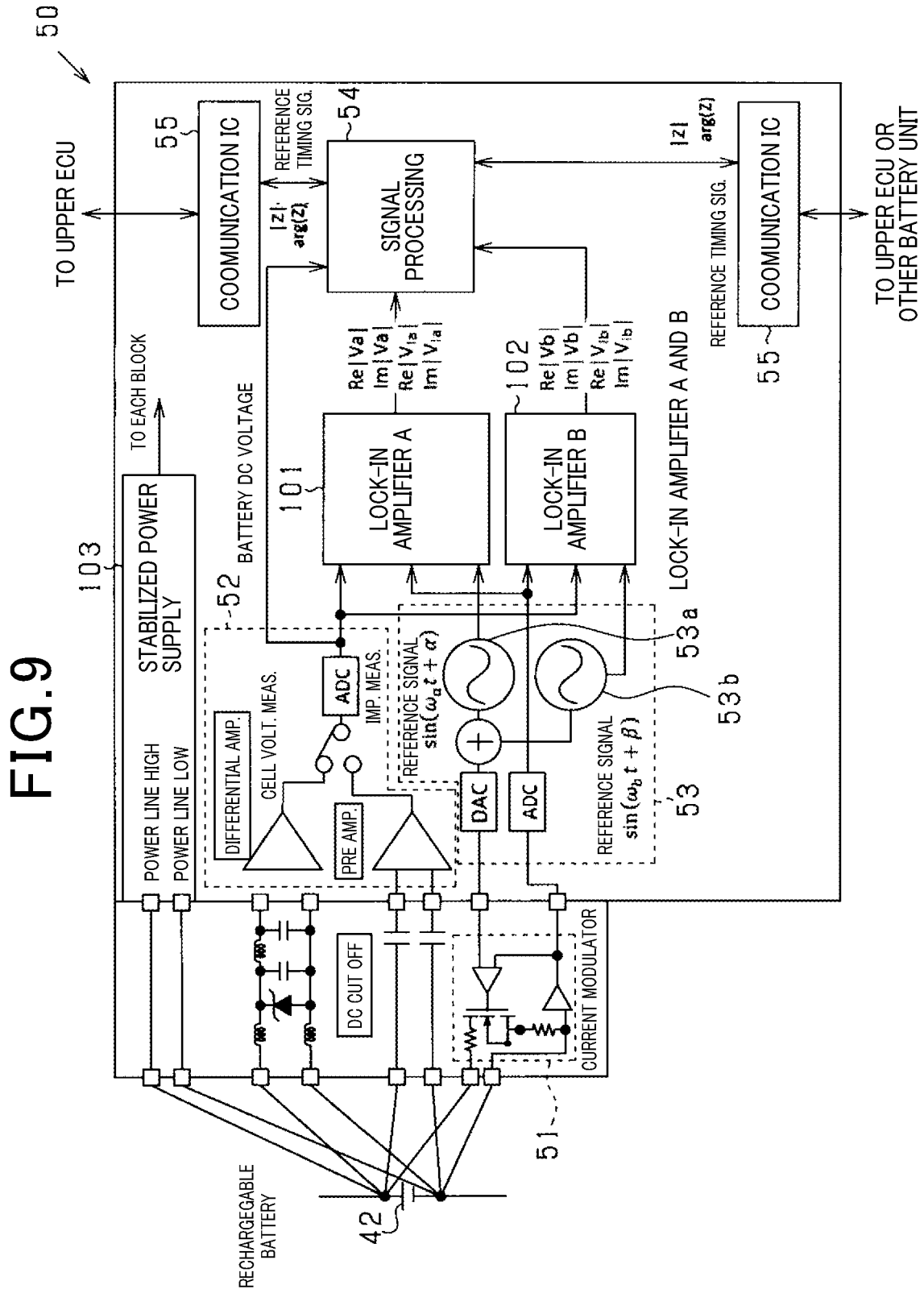
FIG. 9 is a block diagram illustrating a configuration of a battery measurement apparatus according to a modification.

The battery measurement apparatus 50 can include, as illustrated in FIG. 9, a lock-in amplifier 101 for the first oscillator, i.e., a first frequency channel, 53*a* and a lock-in amplifier 102 for the second oscillator, i.e., a second frequency channel, 53*b*.

That is, the lock-in amplifier 101 and the lock-in amplifier 102 can be configured to perform, simultaneously for the first and second frequency channels, a two-phase lock-in detection for the response signal to accordingly analyze the response signal, thus calculating (i) a real part and an imaginary part of the voltage variation as the information on the complex impedance for the first frequency channel and (ii) a real part and an imaginary part of the voltage variation as the information on the complex impedance for the second frequency channel.

Note that, when performing the lock-in detection, each of the lock-in amplifiers 101 and 102 can use a reference signal to multiply the voltage variation by the reference signal. Each of the lock-in amplifiers 101 and 102 can use, as the reference signal, the alternating signal generated by the corresponding one of the first and second oscillators 53*a* and 53*b* or an alternating signal extracted from an actually measured feedback alternating signal.

The above configuration can make it possible to simultaneously calculate the information items on the complex impedance for each of the measurement frequencies.

In FIG. 9, a stabilized power supply 103 can be provided in the battery measurement apparatus 50. The stabilized power supply 103 is connected to high and low power-supply lines of each battery cell 42 to accordingly supply, based on power supplied from the corresponding battery cell 42, stabilized power to each element, such as the processing unit 54, the oscillators 53*a* and 53*b*, and the communication unit 55.

The battery measurement apparatus 50 can be configured to store the measured response signal, i.e., the measured voltage variation, and analyze the stored response signal for each of the measurement frequencies. That is, the battery measurement apparatus 50 can be configured to analyze the stored response signal simultaneously for the measurement frequencies to accordingly calculate simultaneously information items of the complex impedance for the respective measurement frequencies or analyze the stored response signal sequentially for the measurement frequencies to accordingly calculate sequentially information items of the complex impedance for the respective measurement frequencies. This makes it possible to eliminate the need of providing such lock-in amplifiers in the battery measurement apparatus 50.

The battery measurement apparatus 50 of each embodiment can be configured to perform a two-phase lock-in detection for a measured feedback alternating signal to accordingly extract, from the measured feedback alternating signal, an alternating signal actually flowing through a selected battery 42 for each measurement frequency, and calculate, based on the response signal and the measured alternating signal for each of the measurement frequency, information items on the complex impedance for the corresponding one of the measurement frequencies. When performing the two-phase lock-in detection, the battery measurement apparatus 50 can multiply the feedback alternating signal by a reference signal. As the reference signal, each of the alternating signals generated by the corresponding one of the first and second oscillators 53a and 53b can be used.

The processing unit 54 according to each embodiment need not calculate the absolute value and/or the phase of the complex impedance of a selected battery cell 42 for each measurement frequency, and can be configured to output, to an external apparatus, such as the ECU 60, information items on the complex impedance of the selected battery cell 42 for each measurement frequency. The information items on the complex impedance of a selected battery cell 42 for each measurement frequency can include, for example, a real part and an imaginary part of the response signal, i.e., the voltage variation or an actually flowing alternating current of the selected battery cell 42 for the corresponding measurement frequency. Then, the external apparatus, such as the ECU 60, can calculate, based on the information items on the complex impedance of the selected battery cell 42 for each measurement frequency, the absolute value and/or the phase of the complex impedance of the selected battery cell 42 for the corresponding measurement frequency.

The battery measurement apparatus 50 of each embodiment can be applied to various vehicles, such as hybrid electric vehicles (HEV), electric vehicles (EV), plug-in hybrid vehicles (PHV), auxiliary batteries, electric aircrafts, electric motorcycles, or electric vessels.

The battery cells 42 of each embodiment can be connected in parallel to each other.

The battery measurement apparatus 50 of each embodiment is configured to instruct a selected battery cell 42 to output an alternating current as an alternating signal, but can be configured to input, from an external power source, an alternating signal to a selected battery cell 42 as a disturbance. In this modification, the battery measurement apparatus 50 can be configured to input, to a selected battery cell 42, the alternating signal that matches a quantity of electric charge to be charged to the selected battery cell 42 with a quantity of electric charge to be discharged from the selected battery cell 42. In this modification, the battery measurement apparatus 50 can also be configured to input, to a selected battery cell 42, the alternating signal that differentiates a quantity of electric charge to be charged to the selected battery cell 42 from a quantity of electric charge to be discharged from the selected battery cell 42, thus adjusting the SOC of the selected battery cell 42 to a desired value. If the battery measurement apparatus 50 of this modification is installed in a vehicle, a power source installed in the vehicle can be used as the external power source or an additional power source provided outside the vehicle can be used as the external power source.

The battery measurement apparatus 50 of each embodiment can be configured to measure the various states of a rechargeable battery other than the battery pack 40 installed in a vehicle.

The battery measurement apparatus 50 of each embodiment can be configured to change the number of alternating signals, which constitute a composite wave signal.

The battery measurement apparatus 50 of each embodiment is configured such that the first and second oscillators 53a and 53b respectively generate alternating signals, and the modulation signal generator 53 combines the generated alternating signals to one another, but the present disclosure is not limited thereto. Specifically, the battery measurement apparatus 50 according to the present disclosure can be comprised of an oscillator that can generate various alternating signals, each of which has any waveform. As an example, the battery measurement apparatus 50 according to the present disclosure can be comprised of an oscillator that stores various types of waveforms of composite wave signals, and generates various alternating signals, each of which has a selected one of the waveforms stored therein.

The battery measurement apparatus 50 of the second embodiment is configured to estimate a magnitude of the complex impedance for each of measurement frequencies that constitute a composite wave signal, and determine, based on the estimated magnitude of the complex impedance of a selected battery cell 42 for each of the measurement frequencies, an amplitude of a corresponding one of alternating signals. Then, the battery measurement apparatus 50 of the second embodiment is configured to calculate, based on each of the alternating signals, a value of the complex impedance of the selected battery cell 42 for a corresponding one of the alternating signals.

The battery measurement apparatus 50 of the second embodiment can be modified to (I) Determine whether the calculated value of the complex impedance of the selected battery cell 42 is lower than or equal to a predetermined threshold value (II) Increase the amplitude of each of the alternating signals in response to determination that the calculated value of the complex impedance of the selected battery cell 42 is lower than or equal to a predetermined threshold value (III) Calculate, again, a value of the complex impedance of the selected battery cell 42 for each alternating signal in accordance with the corresponding one of the alternating signals This modification improves the complex-impedance measurement accuracy.

The battery measurement apparatus 50 of each embodiment can be configured to store the measured voltage variation and a measured alternating signal outputted from a selected battery cell 42 for each measurement frequency, and analyze the stored response signal and alternating current for each measurement frequency. This makes it possible to eliminate the need of analyzing the voltage variation simultaneously for selected different measurement frequencies.

The battery measurement apparatus 50 of each embodiment can be configured to change the wavenumber of each alternating signal to any wavenumber. For example, the processing unit 54 can be configured to change the wavenumber of each alternating signal during at least one of the electrical loads, which are connected to the battery cells 42, being activated, to be larger than that of the corresponding alternating signal during the electrical loads, which are connected to the battery cells 42, being deactivated.

The present disclosure in the specification is not limited to the exemplary embodiments described set forth above. The present disclosure can include the exemplary embodiments and their modifications created by skilled persons in the art. For example, the present disclosure is not limited to parts and/or elements disclosed in the above embodiments and their combinations. That is, the present disclosure can be implemented by various combinations. The present disclosure can be implemented by various combinations. The present disclosure can include additional components that can be added to any embodiment. The present disclosure can include the embodiments from which at least one part and/or element have been eliminated. The present disclosure can include replacement of at least one part and/or element included in any one of the embodiments with at least one part and/or element included in any other of the embodiments. The present disclosure can include combination of at least one part and/or element included in any one of the embodiments with at least one part and/or element included in any other of the embodiments. The technical scopes disclosed in the present disclosure are not limited to the descriptions of the embodiments. At least one of the technical scopes disclosed in the present disclosure is described in claims. All changes of the embodiments should be included in the present disclosure as long as the changes are within the descriptions of the claims and their equivalent meanings and/or equivalent ranges.

The control apparatuses and their control methods described in the present disclosure can be implemented by a dedicated computer including a memory and a processor programmed to perform one or more functions embodied by one or more computer programs.

The control apparatuses and their control methods described in the present disclosure can also be implemented by a dedicated computer including a processor comprised of one or more dedicated hardware logic circuits.

The control apparatuses and their control methods described in the present disclosure can further be implemented by a processor system comprised of a memory, a processor programmed to perform one or more functions embodied by one or more computer programs, and one or more hardware logic circuits.

The one or more programs can be stored in a non-transitory storage medium as instructions to be carried out by a computer or a processor.

While the present disclosure has been described to be pursuant to the above embodiments, it will be understood that the present disclosure is not limited to the above embodiments and their configurations. The present disclosure will include various modifications and changes of the above embodiments within equivalents of the embodiments. Additionally, various combinations of the above embodiments and combinations of one or more parts of one of the embodiments and one or more parts of another one of the embodiments will be included within the category and/or scope of the present disclosure.

The invention claimed is:

1. A battery measurement apparatus for measuring a state of a rechargeable battery, the battery measurement apparatus comprising:
  a processing circuitry configured to;
    perform one of:
      a first task of causing the rechargeable battery to output a composite wave signal that is combination of at least first and second alternating signals, the first and second alternating signals respectively having first and second frequencies different from one another; and
      a second task of causing the first and second alternating signals to be inputted to the rechargeable battery as the composite wave signal;
  a voltage measurement unit configured to measure a voltage variation across the rechargeable battery in response to the composite wave signal;

wherein:
  the processing circuitry is further configured to:
  analyze, for each of the first and second frequencies, the voltage variation in accordance with the first and second alternating signals and the voltage variation to accordingly calculate information on a complex impedance of the rechargeable battery,
  set a predetermined wavenumber of each of the first and second alternating signals;
  determine whether an input or an output of the predetermined wavenumber of one of the first and second alternating signals to or from the rechargeable battery has completed; and
  switch, in response to determination that the input or output of the predetermined wavenumber of one of the first and second alternating signals to or from the rechargeable battery has completed, the completed one of the first and second alternating signals to a new alternating signal having another frequency while continuing the input or output of the other of the first and second alternating signals to or from the rechargeable battery.

2. The battery measurement apparatus according to claim 1, wherein the processing circuitry is further configured to:
  estimate a magnitude of the complex impedance for each of the first and second frequencies,
  obtain the estimated magnitude of the complex impedance for each of the first and second frequencies; and
  determine, based on the estimated magnitude of the complex impedance for each of the first and second frequencies, an amplitude of the corresponding one of the first and second alternating signals.

3. The battery measurement apparatus according to claim 1, wherein:
  the processing circuitry is further configured to set (i) an amplitude of each of the first and second alternating signals and (ii) an input timing or an output timing of the first and second alternating signals such that an amplitude of the composite wave signal is within a predetermined range.

4. The battery measurement apparatus according to claim 1, wherein:
  the first frequency of the first alternating signal is higher than the second frequency of the second alternating signal; and
  the processing circuitry is further configured to set an output period of the first alternating signal such that the output period of the first alternating signal matches a period of the second alternating signal during which instantaneous values of the second alternating signal are closer to an average of the second alternating signal than to a maximum or minimum of the second alternating signal.

5. The battery measurement apparatus according to claim 1, wherein:
  the processing circuitry is further configured to select the first and second frequencies of the first and second alternating signals while preventing one of the first and second frequencies from becoming an integral multiple of the other of the first and second frequencies.

6. The battery measurement apparatus according to claim 1, wherein:
  the rechargeable battery is electrically connected to at least one electrical load; and
  the processing circuitry is further configured to change the wavenumber of each of the first and second alternating signals during the at least one electrical load being activated to be larger than the wavenumber of a corresponding one of the first and second alternating signals during the at least one electrical load being deactivated.

7. The battery measurement apparatus according to claim 1, further comprising:

at least first and second lock-in amplifiers provided for the first and second alternating signals that constitute the composite wave signal, wherein:

the first and second lock-in amplifiers are configured to analyze the response signal simultaneously for the respective first and second frequencies to accordingly calculate the information on the complex impedance of the rechargeable battery.

8. The battery measurement apparatus according to claim 1, wherein the processing circuitry is implemented by one or more hardware electronic circuits.

9. The battery measurement apparatus according to claim 1, wherein the processing circuitry is implemented by one or more hardware-software hybrid circuits.

10. The battery measurement apparatus according to claim 1, wherein the processing circuitry comprises at least one processor executing program instructions stored in a storage.

11. A battery measurement method to be carried out by a battery measurement apparatus for measuring a state of a rechargeable battery, the battery measurement method comprising:

a performing step of performing one of:

a first task of causing the rechargeable battery to output a composite wave signal that is combination of at least first and second alternating signals, the first and second alternating signals respectively having first and second frequencies different from one another; and a second task of causing the first and second alternating signals to be inputted to the rechargeable battery as the composite wave signal;

a measuring step of measuring a voltage variation across the rechargeable battery in response to the composite wave signal; and a calculating step of analyzing, for each of the first and second frequencies, the voltage variation in accordance with the first and second alternating signals and the voltage variation to accordingly calculate information on a complex impedance of the rechargeable battery, wherein:

the performing step further includes:

setting a predetermined wavenumber of each of the first and second alternating signals;

determining whether an input or an output of the predetermined wavenumber of one of the first and second alternating signals to or from the rechargeable battery has completed;

switching, in response to determination that the input or output of the predetermined wavenumber of one of the first and second alternating signals to or from the rechargeable battery has completed, the completed one of the first and second alternating signals to a new alternating signal having another frequency while continuing the input or output of the other of the first and second alternating signals to or from the rechargeable battery.

* * * * *